US009897678B2

(12) United States Patent
Tan et al.

(10) Patent No.: US 9,897,678 B2
(45) Date of Patent: Feb. 20, 2018

(54) MAGNETIC RESONANCE IMAGING DATA CORRECTION METHODS AND SYSTEMS

(71) Applicant: General Electric Company, Schenectady, NY (US)

(72) Inventors: Ek Tsoon Tan, Mechanicville, NY (US); Christopher Judson Hardy, Schenectady, NY (US); Kevin Franklin King, Menomonee Falls, WI (US); Zachary William Slavens, New Berlin, WI (US); Luca Marinelli, Schenectady, NY (US); Robert Marc Lebel, Calgary (CA)

(73) Assignee: General Electric Company, Niskayuna, NY (US)

( * ) Notice: Subject to any disclaimer, the term of this patent is extended or adjusted under 35 U.S.C. 154(b) by 1123 days.

(21) Appl. No.: 13/866,820

(22) Filed: Apr. 19, 2013

(65) Prior Publication Data

US 2014/0312897 A1 Oct. 23, 2014

(51) Int. Cl.
*G01V 3/00* (2006.01)
*G01R 33/565* (2006.01)
*G01R 33/563* (2006.01)

(52) U.S. Cl.
CPC . *G01R 33/56581* (2013.01); *G01R 33/56572* (2013.01); *G01R 33/56341* (2013.01)

(58) Field of Classification Search
CPC .............. G01R 33/3415; G01R 33/543; G01R 33/5659; G01R 33/36; A61B 5/055
USPC .......................................................... 324/307
See application file for complete search history.

(56) References Cited

U.S. PATENT DOCUMENTS

| 4,591,789 | A | 5/1986 | Glover et al. |
| 6,163,152 | A | 12/2000 | Bernstein et al. |
| 6,479,999 | B1 | 11/2002 | Demeester et al. |
| 6,538,443 | B2 | 3/2003 | Morich et al. |
| 6,969,991 | B2 * | 11/2005 | Bammer .......... G01R 33/56518 324/307 |
| 7,088,099 | B2 | 8/2006 | Doddrell et al. |
| 7,408,345 | B2 | 8/2008 | Bammer et al. |
| 7,902,825 | B2 | 3/2011 | Bammer et al. |
| 2002/0074998 | A1 | 6/2002 | Van Den Brink et al. |

(Continued)

OTHER PUBLICATIONS

Mattiello et al., "Analytical Expressions for the B Matrix in NMR Diffusion Imaging and Spectroscopy", Journal of Resonance Series, pp. 131-141, vol. 108, Issue 2, 1994.

(Continued)

*Primary Examiner* — Walter L Lindsay, Jr.
*Assistant Examiner* — Frederick Wenderoth
(74) *Attorney, Agent, or Firm* — Pabitra K. Chakrabarti

(57) ABSTRACT

Systems and methods for correcting magnetic resonance (MR) data are provided. One method includes receiving the MR data and correcting errors present in the MR data due to non-uniformities in magnetic field gradients used to generate the diffusion weighted MR signals. The method also includes correcting errors present in the MR data due to concomitant gradient fields present in the magnetic field gradients by using one or more gradient terms. At least one of the gradient terms is corrected based on the correction of errors present in the MR data due to the non-uniformities in the magnetic field gradients.

20 Claims, 5 Drawing Sheets

(56) References Cited

U.S. PATENT DOCUMENTS

2011/0043206 A1* 2/2011 Kimura ............ G01R 33/56341
 324/309
2012/0274322 A1* 11/2012 Lee .................... G01R 33/5607
 324/309
2013/0057280 A1* 3/2013 Feiweier ............ G01R 33/4835
 324/309

OTHER PUBLICATIONS

Mardor et al., "Early Detection of Response to Radiation Therapy in Patients With Brain Malignancies Using Conventional and High B-Value Diffusion-Weighted Magnetic Resonance Imaging", J Clin Oncol, pp. 1094-1100, vol. 21, Issue 6, Mar. 15, 2003.

Theilmann et al., "Changes in Water Mobility Measured by Diffusion MRI Predict Response of Metastatic Breast to Chemotherapy", Neoplasia, pp. 831-837, vol. 6, Issue 6, Nov. 2004.

Jovicich et al., "Reliability in Multi-Site Structural MRI Studies Effects of Gradient Non-Linearity Correction on Phantom and Human Data", NeuroImage, pp. 436-443, vol. 30, Issue 2, Apr. 1, 2006.

Baron et al., "The Effect of Concomitant Gradient Fields on Diffusion Tensor Imaging", Magn Reson Med., pp. 1190-1201, vol. 68, Issue 4, Oct. 2012.

Tan et al., "Improved Correction for Gradient Nonlinearity Effects in Diffusion-Weighted Imaging", Journal of Magnetic Resonance Imaging, vol. 37, Issue 2, Nov. 21, 2012.

* cited by examiner

MAGNETIC RESONANCE IMAGING DATA CORRECTION METHODS AND SYSTEMS

BACKGROUND

The subject matter disclosed herein relates generally to magnetic resonance imaging (MRI) systems and, more particularly, to systems and methods for performing diffusion weighted imaging (DWI) with an MRI system.

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

Diffusion-weighted MRI techniques are known in the field of medical diagnosis and medical diagnostic imaging. For example, in some applications, MR DWI may be used as a non-contrast enhanced method for cancer imaging. In these applications, changes in DWI based diffusivity may correlate to the degree of response to cancer treatment, the diffusivity measured at baseline may be predictive of cancer treatment outcome, and so forth.

Conventional DWI techniques typically provide useful information about the diffusion properties of water in an organ of interest, but are associated with a variety of factors that may bias or distort the desired diffusivity measurement. For example, the accuracy and reproducibility of desired diffusion maps or coefficients may be affected by gradient non-linearity. For further example, errors may occur due to concomitant gradient fields (also commonly known as Maxwell fields) resulting from the applied diffusion gradient waveforms. Accordingly, there exists a need for improved systems and methods that address these drawbacks.

BRIEF DESCRIPTION

In one embodiment, a method of correcting magnetic resonance (MR) data includes receiving the MR data, and the MR data corresponds to diffusion weighted MR signals. The method also includes correcting errors present in the MR data due to non-uniformities in magnetic field gradients used to generate the diffusion weighted MR signals and correcting errors present in the MR data due to concomitant gradient fields present in the magnetic field gradients by using one or more gradient terms. At least one of the gradient terms is corrected based on the correction of errors present in the MR data due to the non-uniformities in the magnetic field gradients.

In another embodiment, a magnetic resonance (MR) system includes an imager having an MR magnet and being adapted to acquire diffusion weighted MR raw data. The system also includes a processor adapted to receive the diffusion weighted MR raw data, to perform a gradient non-linearity correction technique on the MR raw data to obtain corrected MR data, and to perform a concomitant field correction technique on the corrected MR data to produce processed MR data. One or more gradient terms used in the concomitant field correction technique is at least partially determined by the corrected MR data.

In another embodiment, a non-transitory computer readable medium encodes one or more executable routines, which, when executed by a processor, cause the processor to perform acts including receiving magnetic resonance (MR) data, wherein the MR data corresponds to diffusion weighted MR signals. The acts also include performing a first correction technique on the MR data to remove errors present in the MR data due to non-uniformities in magnetic field gradients used to generate the diffusion weighted MR signals and performing a spatially dependent second correction technique on the MR data to remove errors present in the MR data due to concomitant gradient fields present in the magnetic field gradients. The second correction technique is modified with one or more outputs produced by performing the first correction technique.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described in more detail below, provided herein are systems and methods for performing diffusion weighted imaging (DWI) using magnetic resonance imaging (MRI) systems. More specifically, various embodiments provided herein may employ correction methods that correct for errors present in MR data due to non-uniformities in magnetic field gradients used to generate diffusion weighted MR signals and/or errors present in the MR data due to concomitant gradient fields (also known as Maxwell fields) present in the magnetic field gradients. As such, presently disclosed embodiments provide for a combined gradient nonlinearity correction (GNC) and concomitant field correction (CFC). In certain embodiments, the CFC may be retrospective with respect to MR data setup and collection and one or more features of the CFC may be corrected with one or more features of the GNC. For example, in one embodiment, one or more gradient terms utilized in the CFC may be corrected with results of the GNC, thereby rendering the CFC spatially dependent. These and other features of presently disclosed embodiments are described in more detail below.

The implementations described herein may be performed by a magnetic resonance imaging (MRI) system, wherein specific imaging routines are initiated by a user (e.g., a radiologist). For example, the implementations described herein may be applicable to a variety of types of diffusion acquisition schemes known to those skilled in the art. For further example, the disclosed embodiments may be utilized with DWI, or any other desired type of diffusion based MRI.

Figure 1:
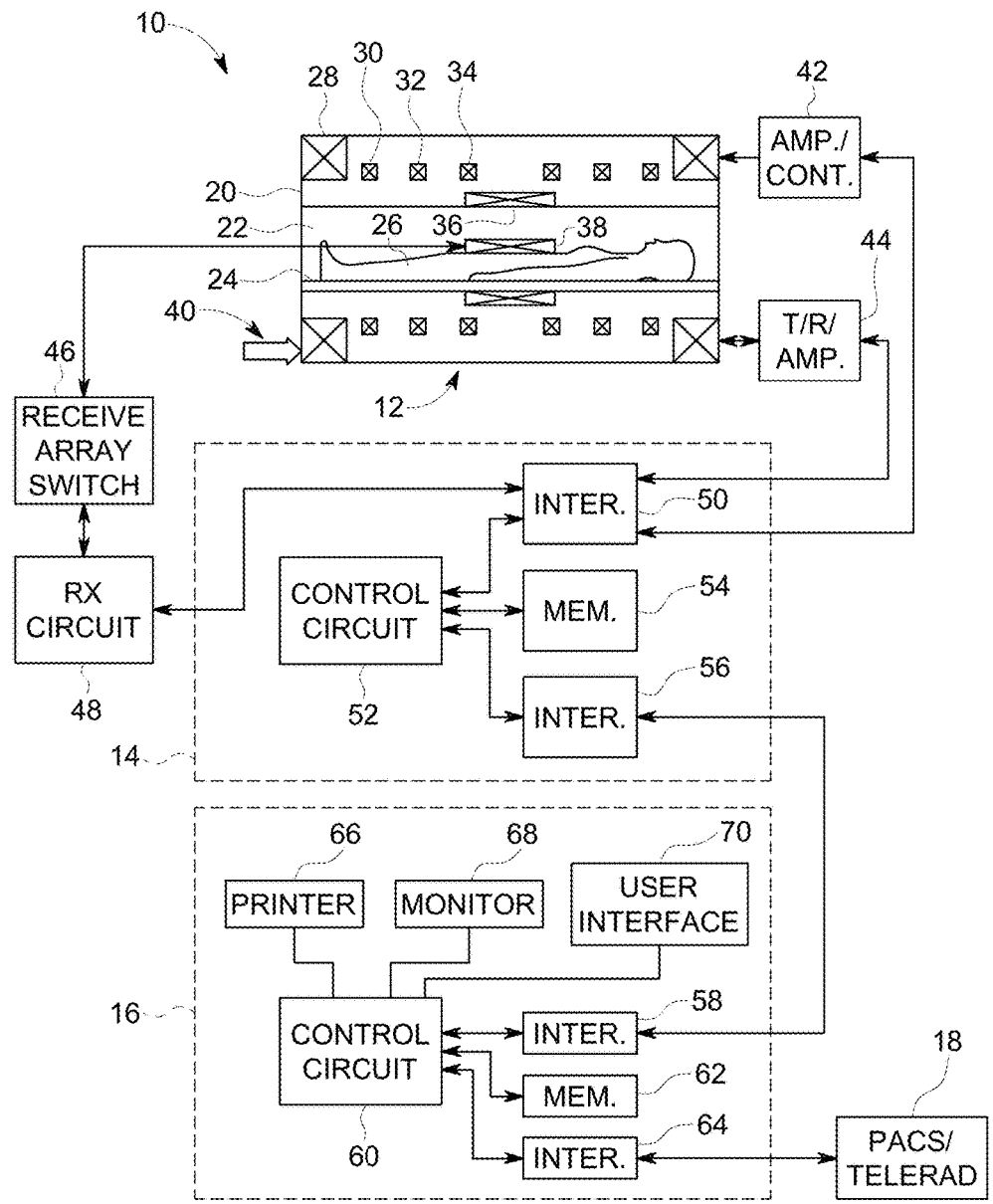
FIG. 1 is a diagrammatical illustration of an embodiment of a magnetic resonance (MR) imaging system configured to acquire diffusion weighted MR images in accordance with an aspect of the present disclosure.

Further, the MRI system may perform data acquisition, data construction, image reconstruction/synthesis, and image processing. Accordingly, referring to FIG. 1, a magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices, such as teleradiology equipment, so that data acquired by the system 10 may be accessed on-site or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient 26. The selected anatomy may be imaged by a combination of patient positioning, selected excitation of certain gyromagnetic nuclei within the patient 26, and by using certain features for receiving data from the excited nuclei as they spin and precess, as described below.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., a phased array of coils) configured for placement proximal to (e.g., against) the patient 26. The receiving coils 38 may have any geometry, including both enclosed and single-sided geometries.

As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. Additionally, a receiving circuit 48 is provided for receiving the data detected by the receiving coils 38, and may include one or more multiplexing and/or amplification circuits.

It should be noted that presently disclosed embodiments may enable a decoupling of the desired diffusion-weighted gradient waveforms utilized to probe the patient 26 and the CFC. For example, by utilizing a retrospective CFC instead of a prospective CFC, the patient 26 may be probed as desired (i.e., without a manipulation of the gradient waveform), and the CFC may be applied to the MR data after acquisition. In some embodiments, the CFC may be enhanced by utilizing the GNC to correct one or more gradient terms in the CFC.

In the illustrated embodiment, scanner control circuit 14 includes an interface circuit 50 for outputting signals for driving the gradient field coils 30, 32, 34 and the RF coil 36. Additionally, interface circuit 50 receives the data representative of the magnetic resonance signals produced in examination sequences from the receiving circuitry 48 and/or the receiving coils 38. The interface circuit 50 is operatively connected to a control circuit 52. The control circuit 52 executes the commands for driving the circuit 42 and circuit 44 based on defined protocols selected via system control circuit 16. Control circuit 52 also serves to provide timing signals to the switch 46 so as to synchronize the transmission and reception of RF energy. Further, control circuit 52 receives the magnetic resonance signals and may perform subsequent processing before transmitting the data to system control circuit 16. Scanner control circuit 14 also includes one or more memory circuits 54, which store configuration parameters, pulse sequence descriptions, examination results, and so forth, during operation. The memory circuits 54, in certain embodiments, may store instructions for implementing at least a portion of the image processing techniques described herein.

Interface circuit 56 is coupled to the control circuit 52 for exchanging data between scanner control circuit 14 and system control circuit 16. Such data may include selection of specific examination sequences to be performed, configuration parameters of these sequences, and acquired data, which may be transmitted in raw or processed form from scanner control circuit 14 for subsequent processing, storage, transmission and display.

An interface circuit 58 of the system control circuit 16 receives data from the scanner control circuit 14 and transmits data and commands back to the scanner control circuit 14. The interface circuit 58 is coupled to a control circuit 60, which may include one or more processing circuits in a multi-purpose or application specific computer or workstation. Control circuit 60 is coupled to a memory circuit 62, which stores programming code for operation of the MRI system 10 and, in some configurations, the image data for later reconstruction, display and transmission. An additional interface circuit 64 may be provided for exchanging image data, configuration parameters, and so forth with external system components such as remote access and storage devices 18. Finally, the system control circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

It should be noted that subsequent to the acquisitions described herein, the system 10 may simply store the acquired data for later access locally and/or remotely, for example in a memory circuit (e.g., memory 56, 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the image processing, correction, and reconstruction methods described herein.

Further, it should be noted that the MRI system 10 may be utilized to implement a variety of suitable diffusion acquisition schemes and to correct the acquired MR data in accordance with the embodiments described herein. For example, the MRI system 10 may be utilized to perform a DWI scan. In such embodiments, in operation, the MRI system 10 is utilized to acquire MR data of the patient 26 and to subsequently process the data to reduce or remove errors present in the data. For example, the MR data may be processed to reduce or remove errors present due to non-uniformities (e.g., nonlinearities) in the magnetic field gradients used to generate the diffusion weighted MR signals. For further example, the MR data may be corrected for errors present in the MR data due to concomitant gradient fields. In certain embodiments, the corrected MR data may be utilized to generate one or more diffusion maps, such as an apparent diffusion coefficient (ADC) map, a fractional anisotropy (FA) map, a relative anisotropy (RA) map, a mean diffusivity (MD) map, or any other desired map. One such method for generating a map corresponding to the imaged tissue is provided in method 72 shown in FIG. 2.

The method 72 includes receiving the diffusion weighted MR raw data (block 74) and performing a first correction of the MR raw data for the contribution of errors introduced by gradient non-uniformities, such as gradient nonlinearities (block 76). In accordance with one embodiment, the equations and steps for gradient nonlinearity correction (GNC) for diffusion imaging are adapted here for completeness. The gradient field map tensor, $\Lambda(r)$ relates the idealized gradient vector $g=[g_X g_Y g_Z]^T$ to the spatially-varying, actual gradient vector $g'(r)=[g'_X(r)\ g'_Y(r)\ g'_Z(r)]^T$, described as a function of its physical location in magnet coordinates, $r=[X\ Y\ Z]^T$. $\Lambda(r)$ is defined by the spatial derivative of the $B_0$-field contributed by each of the three gradient axes, $B'_X(r)$, $B'_Y(r)$ and $B'_Z(r)$ relative to the nominal gradient amplitudes $G_X$, $G_Y$ and $G_Z$:

$$\Lambda(r) = \left[ \frac{\nabla B'_X(r)}{G_X} \frac{\nabla B'_Y(r)}{G_Y} \frac{\nabla B'_Z(r)}{G_Z} \right] \quad [1]$$

where $$\nabla \equiv \left[ \frac{\partial}{\partial_X} \frac{\partial}{\partial_Y} \frac{\partial}{\partial_Z} \right]^T. \quad [2]$$

When the idealized b-matrix (20) b is known, GN effects can be applied directly to obtain the actual b-matrix, b'. With that, the signal $S_i$ for the $i^{th}$ diffusion acquisition relative to its non-diffusion-encoded reference signal $S_0$ can be expressed as a Frobenius inner product $$\ln(S_i/S_0) = -b'_i : D \quad [3]$$
$$= -(\Lambda b_i \Lambda^T) : D.$$

In the absence of the full b-matrix, an approximation maybe made with g and g', both of which are normalized by a scalar b-value, b. This results in $$\ln(S_i/S_0) = -b g'^T_i D g'_i \quad [4]$$
$$= -b g^T_i \Lambda^T D \Lambda g_i.$$

However, in addition to performing the GNC, the method 72 also calls for correcting the raw MR data for the effect of concomitant gradient fields by using gradient terms corrected with the GNC (block 78) before generating one or more diffusion maps with the corrected data (block 80). That is, in certain embodiments, it may be desired or necessary to correct for concomitant field effects resulting from diffusion-gradient waveforms whose magnetic moments do not cancel out. This may occur, for example, in the dual-spin-echo (DSE) diffusion preparation, but may not occur in the single spin-echo (SSE) diffusion preparation.

More specifically, in diffusion-weighted MRI acquisition, a diffusion preparation sequence (or gradient waveforms) is required, which imparts the diffusion weighting on the acquired MRI signal. Typically, the gradient waveforms are placed symmetrically beside the refocusing radiofrequency pulse, imparting no net phase accrual. A common diffusion preparation that uses symmetrical waveforms is known as SSE. Waveforms that are asymmetric include DSE, also known as twice-refocused spin echo (TSE), and may include other novel waveforms that may not currently be known to those skilled in the art. These asymmetric waveforms have a net phase accrual that occurs over a cumulative duration ($\tau$), which result in a concomitant field effect that in turn results in a bias in the obtained diffusion signal. Using a linear sinc approximation, this concomitant field effect can be calculated as a function of $\tau$.

It should be noted that in some embodiments, a full-correction may be performed that utilizes changes in the gradient waveforms to correct both k-space and signal bias effects. However, in the embodiment described below, only the signal bias correction that may be performed retrospectively together with GNC is incorporated. Using the known relation between the spatially-varying concomitant field, $B_c$, and the applied gradient amplitudes, the lowest-order terms obtained from the expansion of Maxwell's equations are $$B_C = \frac{(G_X^2 + G_Y^2)Z^2}{2B_0} + \frac{G_Z^2(X^2+Y^2)}{8B_0} - \frac{G_X G_Y XZ}{2B_0} - \frac{G_Y G_Z YZ}{2B_0}. \quad [5]$$

The spatially-varying signal bias from concomitant field effects is due to intra-slice signal dephasing from spatially-varying Maxwell fields. In addition to $B_c$, other contributing factors to signal dephasing include the duration of accumulated magnetic moment $\tau$, the slice thickness w, the normal vector to the imaging plane $\hat{r}_s$, and b. If the intra-slice dephasing is linear in the slice direction, the concomitant-field-corrected signal $S'_i$ for the $i^{th}$ diffusion measurement is related to the acquired signal $S_i$ by the relation:

$$\ln(S'_i/S_0) = \ln\left[\mathrm{sinc}\left(\frac{w}{2}\gamma\tau(\hat{r}_s \cdot \nabla B_C)\right)\right]. \qquad [6]$$

With the incorporation of gradient nonlinearity into CFC, many of the constant terms of equation 6, in addition to $B_C$, will also become spatially-dependent. Hence, the complete equation with both GNC and CFC in a DSE acquisition is:

$$\ln(S'_i(X,Y,Z)/S_0) = -b'_i(X,Y,Z): D + \qquad [7]$$
$$\ln\left[\mathrm{sinc}\left(\frac{w(X,Y,Z)}{2}\gamma\tau(r'_s(X,Y,Z) \cdot \nabla B_C(X,Y,Z))\right)\right].$$

As shown, equation 6 shows a retrospective CFC that may be performed on MR data after acquisition, and equation 7 shows a combined GNC and CFC correction having retrospective CFC that is further corrected with GNC. That is, as shown in equation 7, utilizing the GNC in the disclosed manner may enhance the CFC by rendering the CFC spatially dependent. For example, in the embodiment of equation 7, the terms $S'_i$, w, $\hat{r}_s$, and $\nabla B_C$ become spatially dependent when the retrospective CFC method represented in equation 6 is further modified with the information obtained via GNC. In this way, one or more of the gradient terms used in the concomitant field correction portion of equation 7 is at least partially determined by the GNC correction.

It should be noted that presently disclosed embodiments, such as the illustrated method 72, enable the novel combination of GNC and CFC type corrections. For example, the CFC is cascaded to the processing pipeline following the GNC for the b-matrix, and the gradient terms used in CFC are corrected with GNC as described above. These features enable a retrospective combined GNC and CFC method that provides further accuracy than that provided with an uncorrected system or a system only corrected with GNC. Further, as compared to systems that employ a prospective CFC, embodiments of the disclosed combined methods do not require gradient waveform manipulation and can be performed on previously acquired data, thus offering additional advantages. In these ways, presently disclosed embodiments resolve both gradient nonlinearity and concomitant field effects retrospectively, which enables existing images to be corrected to improve spatial accuracy, same-scanner reproducibility, and inter-scanner reproducibility of diffusion imaging. This feature may offer advantages, for example, in medical applications in which diffusion metrics are used as biomarkers for diseases such as cancer and stroke.

Figure 2:
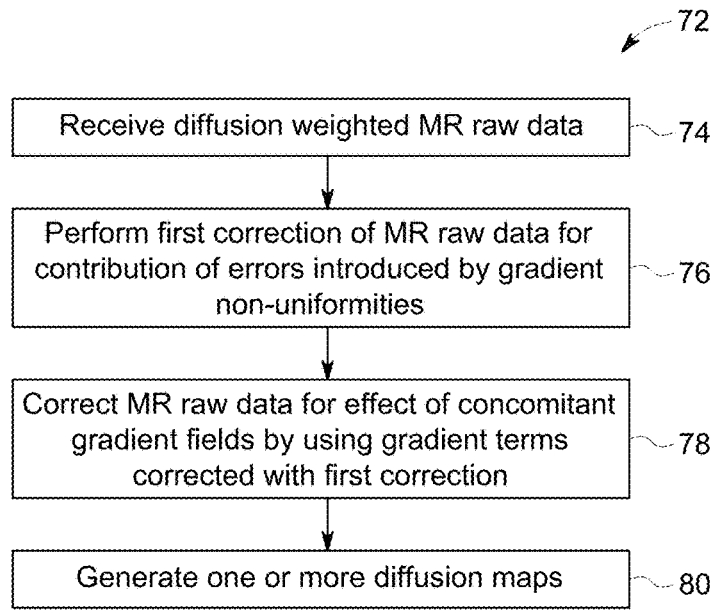
FIG. 2 is a flow diagram illustrating an embodiment of a method that may be utilized to generate one or more corrected diffusion maps in accordance with an aspect of the present disclosure.
Figure 3:
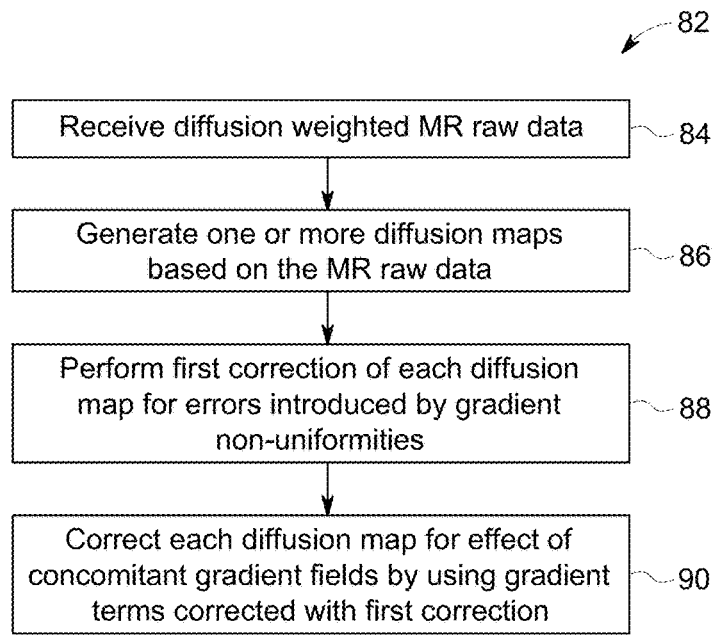
FIG. 3 is a flow diagram illustrating an embodiment of a method that may be utilized to correct one or more diffusion maps in accordance with an aspect of the present disclosure.

It should be noted that in some embodiments the presently disclosed combined GNC and CFC correction method may be applied not to the raw MR data as in the method 72 of FIG. 2, but instead to a diffusion map obtained from the raw MR data. For example, in a method 82 illustrated in FIG. 3, the diffusion weighted MR raw data is received (block 84), for example by a controller or a processor, and one or more diffusion maps are generated based on the received data (block 86). Subsequently, the first correction for errors introduced by gradient non-uniformities is performed on the diffusion maps (block 88) followed by the second correction for concomitant field effects (block 90). However, in some instances, performing the retrospective combined GNC and CFC method on the diffusion maps instead of the raw MR data may result in the use of scalar data instead of vector data, thus giving rise to a different result. Further, it should be noted that although the first and second corrections are represented as separate blocks 76 and 78 in FIG. 2 and blocks 86 and 88 in FIG. 3, it should be understood that in certain embodiments, the retrospective combined GNC and CFC method may be applied such that the GNC and CFC corrections are performed concurrently, for example, by implementing equation 7.

Figure 4:
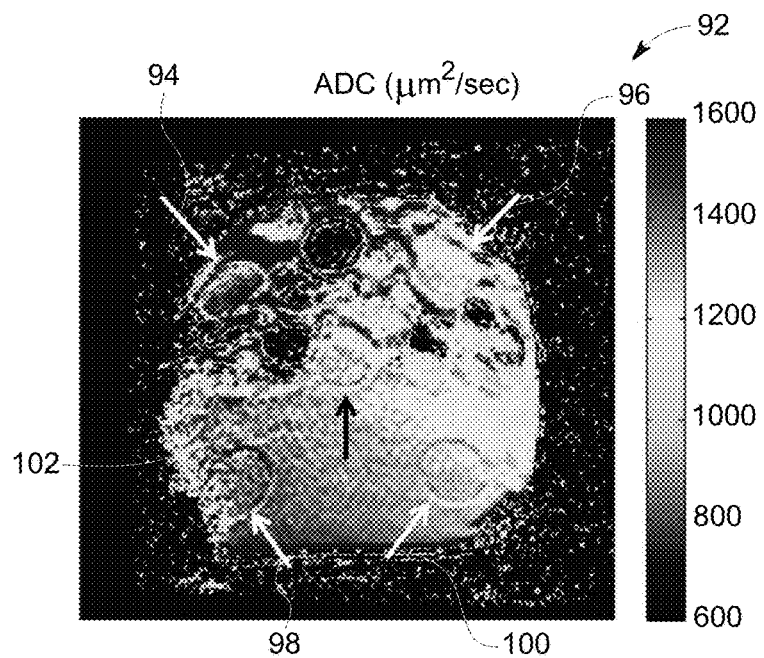
FIG. 4 illustrates an apparent diffusion coefficient map generated from raw MR data of an axial section of a phantom in accordance with an embodiment.

FIGS. 4-7 illustrate experimental results obtained for an ice-bath phantom and processed in accordance with a presently disclosed embodiment. More specifically, FIG. 4 illustrates a control ADC map 92 for an axial section of a phantom having five circular water regions with an assumed true ADC of approximately 1100 $\mu m^2$/sec positioned 11 cm right of isocenter in a 55-cm patient bore system. The control ADC map 92 is representative of a map that has neither been corrected for errors present in the raw MR data due to non-linearities in the magnetic field gradients nor for concomitant gradient field errors. Further, arrows 94, 96, 98, 100, and 102 point to the locations of five cylindrical tubes filled with distilled water that were oriented longitudinally in the MRI scanner during data acquisition.

Figure 5:
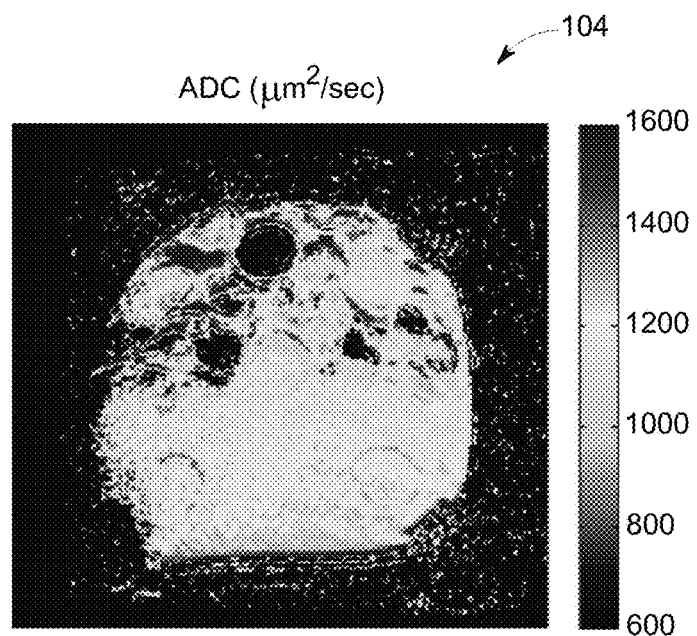
FIG. 5 illustrates a corrected apparent diffusion coefficient map generated from raw MR data of an axial section of a phantom in accordance with an embodiment.

FIG. 5 illustrates an ADC map 104 generated with the same data used to generate the control ADC map 92 but which reflects a retrospective combined GNC and CFC correction performed in accordance with equation 7. To measure ADC when generating each of these maps 92 and 104, five circular regions of 5 mm diameter were manually placed on each axial image slice, one for each of the five tubes of water. Further, only the 10 central slices of the phantom were used to avoid gross errors and echo planar imaging distortion. Additionally, in the analysis shown in the plots 106 and 122 of FIGS. 6 and 7, the mean ADC for each region of interest (ROI) was calculated.

Figure 6:
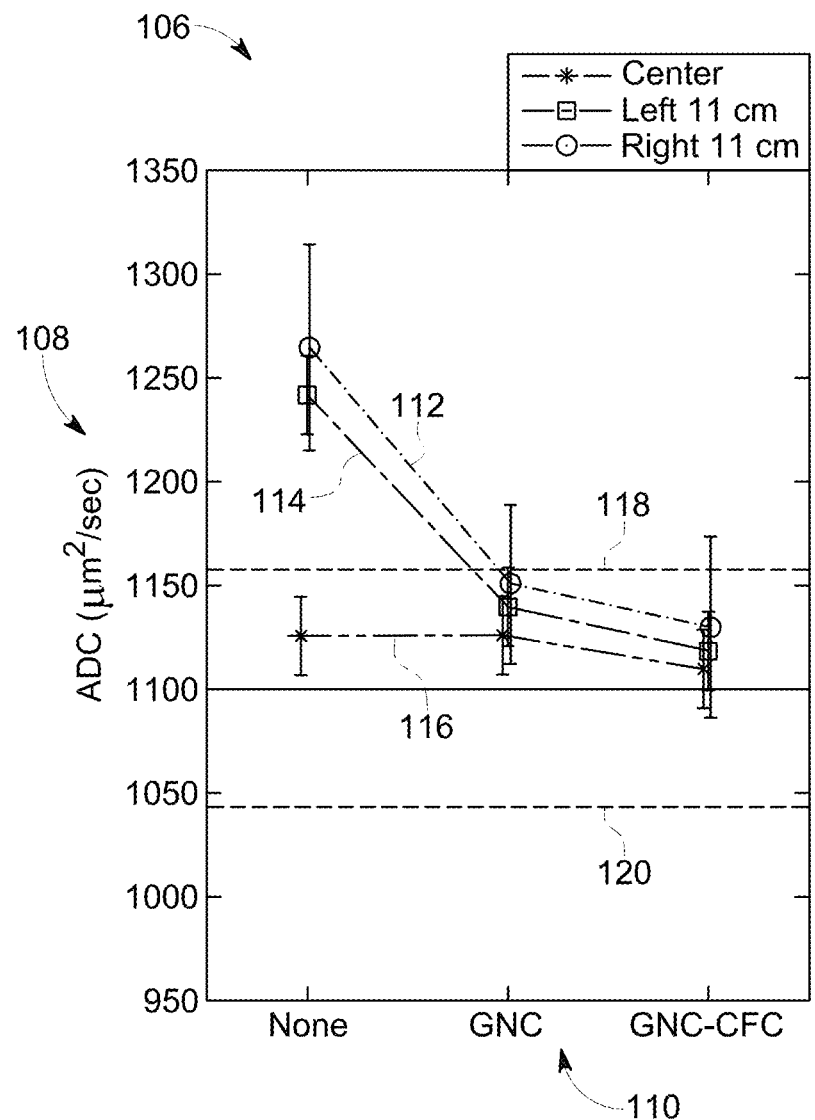
FIG. 6 is an apparent diffusion coefficient plot illustrating non-corrected and corrected apparent diffusion coefficients acquired with a first imaging system.

FIG. 6 illustrates ADC value plots 112, 114, and 116 generated from imaging acquisitions performed on the phantom with the phantom positioned 11 cm right of the magnet isocenter, 11 cm left of the magnet isocenter, and at the magnet isocenter, respectively, in a 55-cm bore MRI system. Each plot shows ADC values lying along the ADC axis 108 for each of the correction methods lying along the correction method axis 110. Further, dashed lines 118 and 120 indicate ±5% offsets from the assumed true ADC of 1100 $\mu m^2$/sec.

As shown in the plots 112, 114, and 116, the ADC values obtained without applying any correction are farther from the assumed true ADC than the ADC values obtained when a traditional GNC correction is applied. However, when the retrospective combined GNC and CFC method outlined in equation 7 is applied, the ADC values are even closer to the assumed true ADC value. That is, by applying an embodiment of the retrospective GNC and CFC method disclosed herein, statistically significant improvements in the ADC values are obtained at all three positions within the imaging system.

Figure 7:
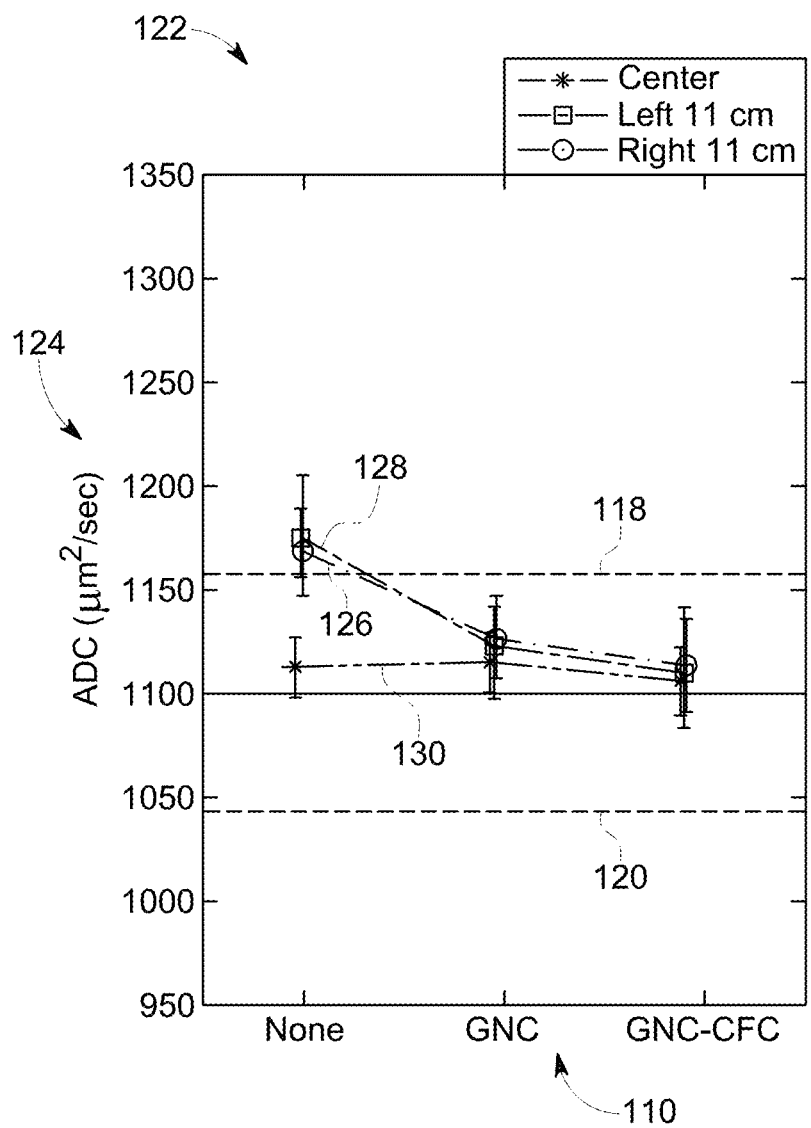
FIG. 7 is an apparent diffusion coefficient plot illustrating non-corrected and corrected apparent diffusion coefficients acquired with a second imaging system.

FIG. 7 illustrates ADC value plots 126, 128, and 130 generated from imaging acquisitions performed on the phantom with the phantom positioned 11 cm right of the magnet isocenter, 11 cm left of the magnet isocenter, and at the magnet isocenter, respectively, in a 60-cm bore MRI system in which the extent of the original ADC value error was reduced. Here again, each plot shows ADC values lying along the ADC axis 124 for each of the correction methods.

As shown in the plots 126, 128, and 130, the ADC values obtained without applying any correction or when applying just the GNC correction are farther from the assumed true ADC than the ADC values obtained when an embodiment of the disclosed combined GNC and CFC correction is applied. Here again, the benefits of applying an embodiment of the retrospective GNC and CFC method disclosed herein can be seen insomuch as the determined ADC value is closer to the true ADC value when the combined GNC and CFC method is applied. Specifically, in these experimental results, the combination of GNC with a DSE pulse sequence and a retrospective concomitant field correction was found to reduce ADC error due to spatial variance from 9.5% to 1.8% (55 cm bore system) and from 4.2% to 1.8% (60 cm bore system).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of correcting magnetic resonance (MR) data, comprising:
    receiving the MR data, wherein the MR data corresponds to diffusion weighted MR signals;
    correcting errors present in the MR data due to non-uniformities in magnetic field gradients used to generate the diffusion weighted MR signals; and
    correcting additional errors present in the MR data due to concomitant gradient fields present in the magnetic field gradients by using one or more gradient terms, wherein at least one of the gradient terms is corrected based on the correction of errors present in the MR data due to the non-uniformities in the magnetic field gradients.

2. The method of claim 1, wherein the MR data comprises raw MR data derived directly from the diffusion weighted MR signals detected by a detector after a subject is excited by a magnetic field.

3. The method of claim 1, wherein the MR data comprises one or more diffusion maps.

4. The method of claim 3, wherein the one or more diffusion maps comprise one or more apparent diffusion coefficient maps.

5. The method of claim 1, wherein the non-uniformities in the magnetic field gradients comprise non-linearities in the magnetic field gradients.

6. The method of claim 1, wherein the at least one of the gradient terms is corrected to be spatially dependent.

7. The method of claim 1, wherein correcting errors present in the MR data due to non-uniformities in magnetic field gradients comprising performing a gradient non-linearity correction.

8. The method of claim 1, wherein correcting errors present in the MR data due to concomitant gradient fields comprises performing concomitant field correction.

9. A magnetic resonance (MR) system, comprising:
    an imager comprising an MR magnet and being configured to acquire diffusion weighted MR raw data; and
    a processor configured to receive the diffusion weighted MR raw data, to perform a gradient non-linearity correction technique on the MR raw data to obtain corrected MR data, and to perform a concomitant field correction technique in addition to the gradient non-linearity correction on the corrected MR data to produce processed MR data, wherein one or more gradient terms used in the concomitant field correction technique is at least partially determined by the corrected MR data.

10. The system of claim 9, wherein the one or more gradient terms are modified by the corrected MR data to become spatially dependent.

11. The system of claim 9, wherein the imager comprises a plurality of gradient field coils, a radiofrequency (RF) transmit coil, and an array of receiving coils.

12. The system of claim 9, wherein the processor is configured to generate at least one diffusion map based on the processed MR data.

13. The system of claim 12, wherein the at least one diffusion map comprises at least one of an apparent diffusion coefficient map, a fractional anisotropy map, and a relative anisotropy map.

14. The system of claim 12, wherein the processor is further configured to utilize the at least one diffusion map to reconstruct one or more images of an imaged portion of a subject.

15. A non-transitory computer readable medium encoding one or more executable routines, which, when executed by a processor, cause the processor to perform acts comprising:
    receiving magnetic resonance (MR) data, wherein the MR data corresponds to diffusion weighted MR signals;
    performing a first correction technique on the MR data to remove errors present in the MR data due to non-uniformities in magnetic field gradients used to generate the diffusion weighted MR signals; and
    performing a spatially dependent second correction technique on the MR data to remove errors present in the MR data due to concomitant gradient fields present in the magnetic field gradients, wherein the second correction technique is modified with one or more outputs produced by performing the first correction technique.

16. The computer readable medium of claim 15, wherein the first correction technique comprises gradient non-linearity correction (GNC).

17. The computer readable medium of claim 15, wherein the spatially dependent second correction technique comprises a retrospective concomitant field correction.

18. The computer readable medium of claim 15, wherein the MR data comprises one or more diffusion maps.

19. The computer readable medium of claim 18, wherein the one or more diffusion maps comprises at least one of an apparent diffusion coefficient map, a fractional anisotropy map, and a relative anisotropy map.

20. The computer readable medium of claim 15, wherein the MR data corresponds to diffusion weighted MR signals acquired via a dual spin echo diffusion imaging operation.

* * * * *